United States Patent
De Clippel

(10) Patent No.: US 6,954,771 B2
(45) Date of Patent: Oct. 11, 2005

(54) ADAPTIVE LINE ENHANCER

(75) Inventor: Erik Edward Mark De Clippel, Leuven (BE)

(73) Assignee: Koninklijke Philips Electronics N.V., Eindhoven (NL)

(*) Notice: Subject to any disclaimer, the term of this patent is extended or adjusted under 35 U.S.C. 154(b) by 650 days.

(21) Appl. No.: 10/015,893

(22) Filed: Nov. 1, 2001

(65) Prior Publication Data

US 2002/0191688 A1 Dec. 19, 2002

(30) Foreign Application Priority Data

Nov. 1, 2000 (EP) .............................................. 00203808

(51) Int. Cl.[7] .............................................. G06F 17/10
(52) U.S. Cl. ........................ 708/312; 708/317; 708/322
(58) Field of Search ................................ 708/312, 317, 708/322

(56) References Cited

U.S. PATENT DOCUMENTS

| | | | |
|---|---|---|---|
| 5,808,924 A | * | 9/1998 | White .......................... 708/313 |
| 5,960,091 A | * | 9/1999 | White et al. .................. 381/98 |
| 6,611,602 B1 | * | 8/2003 | White et al. .................. 381/98 |

FOREIGN PATENT DOCUMENTS

| | | | |
|---|---|---|---|
| EP | 0343278 A1 | 11/1989 | .......... H03H/17/02 |
| WO | WO9711538 | 3/1997 | ........... H04B/15/00 |

* cited by examiner

*Primary Examiner*—D. H. Malzahn
(74) *Attorney, Agent, or Firm*—Edward W. Goodman

(57) ABSTRACT

An improved adaptive line enhancer includes an adaptive Gray-Markel lattice notch filter having an adaptive notch frequency, in which the notch frequency is determined according to a notch frequency variable k. The value of k for the $n+1^{th}$ sample period is determined according to the following equation:

$$k(n+1)=k(n)-\text{sgn}[y(n)]\text{sgn}[\text{UPDATEFN}]\times\mu$$

in which y(n) is the notch filter output, $\mu$ is the adaptation constant, and UPDATEFN has a transfer function in the z-transform domain of:

$$\frac{(\alpha - 1)(k(n) - 1)z^{-1}}{1 + k(n)(1 + \alpha)z^{-1} + \alpha z^{-2}}$$

in which $\alpha$ determines the bandwidth and k(n) is a variable for determining the current notch frequency. The algorithm for adapting the notch frequency enables the notch frequency to be directly calculated from knowledge of internal variables of the wave digital filter.

7 Claims, 3 Drawing Sheets

ADAPTIVE LINE ENHANCER

BACKGROUND OF THE INVENTION

1. Field of the Invention

The present invention relates to adaptive line enhancers, and to methods for adaptive line enhancement. Applications for the invention lie in the fields of radar, sonar, communications and other related disciplines where digital signal processing may be required.

2. Description of the Related Art

Detection of sinusoidal signals immersed in noise is a fundamental problem in signal processing. The retrieval of sinusoidal or other narrow-band signals which may have been significantly attenuated, frequency shifted because of Doppler effects and corrupted by interference and noise, has conventionally been carried out using analysis of the signal in the frequency domain. This requires the input signal to be Fourier transformed. Once the signal has been Fourier transformed, the strongest spectral component can be detected and a filter designed to either enhance or reject this frequency. For the detection of sinusoids with time-varying frequencies, a Fourier transform with sliding windows can be used. Despite the availability of algorithms, such as the fast Fourier transform (FFT) which are computationally efficient when compared to a direct implementation of the discrete Fourier transform, the frequency domain analysis of the input signal is still relatively inefficient when compared to adaptive line enhancement techniques.

Adaptive line enhancement is an alternative technique to frequency domain analysis based on FFTs. It has been shown (B. Widrow and S. D. Stearns, "Adaptive Signal Processing", Prentice-Hall, 1985) that Adaptive Line Enhancers (ALEs) require fewer computations than FFT-based techniques and, in certain circumstances, can be more sensitive detectors of sinusoids. The ALE consists of a filter, and an adaptation rule for changing some feature of the filter's frequency response characteristics. Various combinations of filters and adaptation rules have been proposed, with the most recently reported embodiments comprising a lattice Gray-Markel adaptive notch filter and adaptation rules based on a simplified gradient technique (N. I. Cho, C.-H. Choi and S. U. Lee, "Adaptive Line Enhancement by Using an IIR Lattice Notch Filter," IEEE Trans. Acoust., Speech, Signal Processing, vol. 37, April 1989; P. A. Regalia, "An Improved Lattice-Based Adaptive IIR Notch filter," IEEE Trans. Signal Processing, vol. 39, pp. 2124–2128, September 1991). It has been shown that such ALEs provide better convergence to the frequency of interest than previous designs and, in addition, are less sensitive to the finite word length effects which occur in any digital processor.

The transfer function of the Gray-Markel lattice notch filter is expressed as:

$$H_{lattice} = \frac{N(z)}{D(z)} = \left(\frac{1+\alpha}{2}\right)\frac{1 + 2k_0 z^{-1} + z^{-2}}{1 + k_0(1+\alpha)z^{-1} + \alpha z^{-2}} \quad \text{(Equation A)}$$

where $k_0$ determines the notch frequency and where $\alpha$ determines the bandwidth. The notch frequency determining variable $k_0$ should converge to $-\cos(\omega_0)$ to reject a sinusoid with frequency $\omega_0$. This filter has zeros on the unit circle at $z_0 = e^{\pm i\omega_0}$, where $\omega_0 = \cos^{-1}(-k_0)$. The -3 dB attenuation bandwidth BW of the magnitude response of the Gray-Markel lattice notch filter is determined by the following equation:

$$BW = \cos^{-1}\left(\frac{2\alpha}{1+\alpha^2}\right)$$

A slight gain correction of $$\left(\frac{1+\alpha}{2}\right)$$

is needed to achieve unity gain in the passband.

The bandwidth and the notch frequency can be controlled separately by changing $k_0$ and $\alpha$. This filter structure can easily be implemented using either a direct form realization or a lattice filter structure based on wave digital filters (WDFs) (A. Fettweis and H. Levin and A. Sedlmeyer, "Wave Digital Lattice Filters," Int. J. Circuit Theory Applicat, vol. 2, no. 2, pp. 203–211, June 1974; A. Fettweis, "Wave Digital Lattice Filters: Theory and practice (invited paper)," Proc. IEEE, vol. 74, pp. 270–327, February 1986).

Referring to FIG. 1, there is shown a block diagram showing functional elements for implementing a known wave digital filter realization of the Gray-Markel notch filter response, the transfer function of which is given in Equation A.

In FIG. 1, there is shown an input 110, a first dynamic adapter block 120, a second dynamic adapter block 130, a summing block 140, an amplifier block 150, an output 160, a notch bandwidth determining block 170 and a notch frequency determining block 180.

An input signal 110 is fed to a first input of the summing block 140 and to a first input of the first dynamic adapter block 120. A first output of the first dynamic adapter block 120 is fed to a second input of the summing block 140. The output of the summing block 140, comprising the result of the addition of input 110 and a first output of the first dynamic adapter block 120, is fed to the input of the amplifier block 150. The amplifier block 150 has a fixed amplitude gain of 0.5. This gain is achieved by a bit-shift operation, and thus, does not require a multiplier. The output of the amplifier block 150 becomes the output signal 160.

A second output of the first dynamic adapter block 120 is left unconnected. A third output of the first dynamic adapter block 120 is fed to a first input of the second dynamic adapter block 130, said third output, in combination with the second dynamic adapter adapter 130, forming a feedback path around the first dynamic adapter block 120.

A first output of the second dynamic adapter block 130 is fed back to a second input of the first dynamic adapter block 120. The output of the notch bandwidth determining block 170 is fed to a third input of the first dynamic adapter block 120.

A second output of the second dynamic adapter block 130 is left unconnected. A third output of the second dynamic adapter block 130 is fed back to a second input of the second dynamic adapter block 130. The output of the notch frequency determining block 180 is fed to a third input of the second dynamic adapter block 130.

FIG. 2 shows a block diagram showing functional elements for implementing the dynamic adapters 120 and 130.

In FIG. 2, there is shown a first input 210, a second input 220, a third input 230, a first subtracter block 240, a multiplier 250, a second subtracter block 260, a third subtracter block 270, a delay block 280, a first output 285, a second output 290 and a third output 295.

The first input 210 is fed to the positive input terminal of the first subtracter block 240 and to the negative input terminal of the third subtracter block 270. A second input 220 is fed to the negative input terminal of the first subtracter block 240 and the negative input terminal of the second subtracter block 260. The output of the first subtracter block 240, comprising the difference of the first input 210 and the second input 220, is fed to a first input terminal of the multiplier 250. A third input 230 is fed to a second input terminal of the multiplier 250. The output of the multiplier 250, comprising the product of the third input 230 and the output of the first subtracter block 240, is fed to the positive input terminal of the second subtracter block 260 and to the positive input terminal of the third subtracter block 270. The output of the second subtracter block 260, comprising the difference of the output of the multiplier block 250 and the second input 220, becomes the first output 285. The output of the third subtracter block 270, comprising the difference of the output of the multiplier 260 and the first input 210, becomes the second output 290 and is also fed to the delay block 280. The delay block 280 delays the signal by one sample period then feeds it to the third output 295.

The time domain response of the dynamic adapter can be evaluated. From an initial state where the values of all inputs and outputs are zero, a train of pulses $a_1, a_2, \ldots, a_n, a_{n+1}, \ldots$ is applied to the first input 210, a train of pulses $b_1, b_2, \ldots, b_n, b_{n+1}, \ldots$ is applied to the second input 220, and the constant K is applied to the third input 230. Then the outputs at the nth time step become:

First output 285 $(a_n - b_n) \times K - b_n$

Second output 290 $(a_n - b_n) \times K - a_n$

Third output 295 $(a_{n-1} - b_{n-1}) \times K - a_{n-1}$

The time domain response of the dynamic adapter, shown in feedback configuration in FIG. 5 (and in the dashed box in FIG. 1), can be evaluated. From an initial state where the values of all inputs and outputs are zero, when a train of pulses $u(1), u(2), \ldots, u(n), u(n+1), \ldots$ is applied to the input 510 and the constant K (520) is applied to third input of dynamic adapter block 530, the equation for the output 540 at the nth time step becomes:

Output 540 $y(n) = K \times u(n) + u(n-1) - K \times y(n-1)$

This corresponds to an all-pass transfer function in the z-transform domain of $$H_{adaptor} = \frac{K + z^{-1}}{1 + Kz^{-1}}$$

It is desirable to reduce the computational complexity of ALEs.

SUMMARY OF THE INVENTION

It is an object of the present invention to provide an apparatus for adaptive line enhancement using a computationally efficient adaptation mechanism for an adaptive Gray-Markel lattice notch filter.

It is a further object of the present invention to provide a method for adaptive line enhancement using a computationally efficient adaptation mechanism for an adaptive Gray-Markel lattice notch filter.

The inventor has determined that an ALE of reduced computational complexity can be achieved by applying a new adaptation algorithm. An algorithm for adapting the notch frequency determining variable, $k_0$, by the recursive Gauss-Newton algorithm with simplified gradient and sgn-sgn adaptation rule is as follows:

Algorithm 1:
Input signal is U(z)
Gray-Markel notch filter:

$$H_{lattice} = \frac{N(z)}{D(z)} = \left(\frac{1+\alpha}{2}\right)\frac{1 + 2k_0 z^{-1} + z^{-2}}{1 + k_0(1+\alpha)z^{-1} + \alpha z^{-2}}$$

Output signal is $Y(z) = H_{lattice} \times U(z)$
Attempt to minimize the expected value of the energy of the output $E(y^2)$
Filter Operations (for each input sample):
Calculate notch filter output y(n) using WDF filter structure (see FIG. 1)
Adapt k according to Equation C (below) in which x(n−1) is the simplified gradient of the current sample and relates to input u(n) as shown in Equation B.

$$x(n) = \frac{1}{D(z)}u(n) = u(n) - k(n)(1+\alpha)x(n-1) - \alpha x(n-2) \quad \text{(Equation B)}$$

$$k(n+1) = k(n) - \text{sgn}[x(n-1)y(n)]\mu \quad \text{(Equation C)}$$

$\mu$ is the adaptation constant.
Stability monitoring: clip k(n+1) within range ]−1 1[

The adaptation constant $\mu$ determines the rate of convergence of the algorithm on $k_0$, and also puts bounds upon the achievable mean accuracy of the estimation of k0.

To avoid the calculation of the simplified gradient x(n−1) needed for the update of $k_0$, the internal variables of the WDF filter structure of the Gray-Markel notch filter are studied.

The table below shows a z-transform domain transfer function of the internal variables in the signal flow graph of the wave digital filter structure shown in FIG. 1.

| Internal Variable | Transfer function |
|---|---|
| Input | 1 |
| Output | $\left(\frac{1+\alpha}{2}\right)\frac{1 + 2k_0 z^{-1} + z^{-2}}{1 + k_0(1+\alpha)z^{-1} + \alpha z^{-2}}$ |
| Out1 Adapter1 | $\left(\frac{1+\alpha}{2}\right)\frac{\alpha + k_0(1+\alpha)z^{-1} + z^{-2}}{1 + k_0(1+\alpha)z^{-1} + \alpha z^{-2}}$ |
| Out3 Adapter1 = In1 Adapter2 | $(\alpha - 1)z^{-1}\frac{1 + k_0 z^{-1}}{1 + k_0(1+\alpha)z^{-1} + \alpha z^{-2}}$ |
| In2 Adapter1 = Out1 Adapter2 | $(\alpha - 1)z^{-1}\frac{k_0 + z^{-1}}{1 + k_0(1+\alpha)z^{-1} + \alpha z^{-2}}$ |
| In2 Adaptor2 = Out3 Adapter2 | $\frac{(\alpha - 1)(k_0 - 1)z^{-2}}{1 + k_0(1+\alpha)z^{-1} + \alpha z^{-2}}$ |
| Out2 Adapter2 | $\frac{(\alpha - 1)(k_0 - 1)z^{-1}}{1 + k_0(1+\alpha)z^{-1} + \alpha z^{-2}}$ |

It can be seen from the definition of simplified gradient × (N−1) given in Equation B and from the z-transform domain transfer functions of the internal variables of the wave digital filter shown in FIG. 1, that the third output of second dynamic adapter block 130 corresponds to (α−1) (k₀−1)×

(n−2), and that the second output of second dynamic adapter block 130 corresponds to $(\alpha-1)(k_0-1)\times(n-1)$.

Since both $|\alpha|<1$ and $|k|<1$ as a fundamental requirement for stability of the Gray-Markel filter, the product $(\alpha-1)(k_0-1)$ is always positive. Therefore:

$$\text{sgn}[x(n-1)y(n)]=\text{sgn}[y(n)]\text{sgn}[\text{Out}_2\text{Adaptor}_2] \quad \text{(Equation D)}$$

This equation makes the calculation of simplified gradients unnecessary and leads to a new algorithm for an ALE using a low complexity adaptive lattice notch filter based on wave digital filters. The algorithm is as follows:

Algorithm for Adaptive Line Enhancer using a Low Complexity Adaptive Lattice Notch Filter based on Wave Digital Filters:

Input signal is u(n) with n starting at time 0 (U(z) in frequency domain notation)

Gray-Markel notch filter:

$$H_{lattice}=\frac{N(z)}{D(z)}=\left(\frac{1+\alpha}{2}\right)\frac{1+2k_0z^{-1}+z^{-2}}{1+k_0(1+\alpha)z^{-1}+\alpha z^{-2}}$$

Output signal is $Y(z)=H_{lattice}\times U(z)$

Attempt to minimize the expected value of the energy of the output $E(Y^2)$

Initialization:
Initialize $\text{Out}_3\text{Adaptor}_1(-1)$
Initialize $\text{Out}_3\text{Adaptor}_2(-1)$ Filter Operations (for each input sample u(n)):
Calculate notch filter output y(n) using WDF filter structure with input u(n)(see FIG. 1):

$$\text{Out}_3\text{Adaptor}_1(n)=\text{Out}_2\text{Adaptor}_1(n-1)$$

$$\text{Out}_3\text{Adaptor}_2(n)=\text{Out}_2\text{Adaptor}_2(n-1)$$

$$\text{Out}_1\text{Adaptor}_2(n)=k(n)\times[\text{Out}_3\text{Adaptor}_1(n)-\text{Out}_3\text{Adaptor}_2(n)]-\text{Out}_3\text{Adaptor}_2(n)$$

$$\text{Out}_2\text{Adaptor}_2(n)=k(n)\times[\text{Out}_3\text{Adaptor}_1(n)-\text{Out}_3\text{Adaptor}_2(n)]-\text{Out}_3\text{Adaptor}_1(n)$$

$$\text{Out}_1\text{Adaptor}_1(n)=\alpha\times[u(n)-\text{Out}_1\text{Adaptor}_2(n)]-\text{Out}_1\text{Adaptor}_2(n)$$

$$\text{Out}_2\text{Adaptor}_1(n)=\alpha\times[u(n)-\text{Out}_1\text{Adaptor}_2(n)]-u(n)$$

$$y(n)=0.5\times[u(n)+\text{Out}_1\text{Adaptor}_1(n)]-u(n)$$

Update of the variable k determining the notch frequency (see FIG. 3):

$$k(n+1)=k(n)-\text{sgn}[y(n)]\text{sgn}[\text{Out}_2\text{Adaptor}_2]\times\mu$$

$\mu$ is the adaptation constant.

Thus $\text{Out}_2\text{Adaptor}_2$ can be used as an update function (UPDATEFN) for an update of the variable k used to determine the notch frequency in a given sampling period. As referred to above, UPDATEFN therefore has a transfer function in the z-transform domain, in this case, in an nth sampling period of:

$$\frac{(\alpha-1)(k(n)-1)z^{-1}}{1+k(n)(1+\alpha)z^{-1}+\alpha z^{-2}}$$

Stability monitoring: clip k(n+1) within range]−1 1[.

According to the present invention, in a first aspect, there is provided an adaptive line enhancer comprising an adaptive Gray-Markel lattice notch filter having an adaptive notch frequency, in which the notch frequency is determined according to a notch frequency variable k, characterized in that the value of k for the n+1$^{th}$ sample period is determined according to the following equation:

$$k(n+1)=k(n)-\text{sgn}[y(n)]\text{sgn}[\text{UPDATEFN}]\times\mu$$

in which y(n) is the notch filter output, $\mu$ is the adaptation constant, and UPDATEFN has a transfer function in the z-transform domain of:

$$\frac{(\alpha-1)(k(n)-1)z^{-1}}{1+k(n)(1+\alpha)z^{-1}+\alpha z^{-2}}$$

in which $\alpha$ determines the bandwidth and k(n) is a variable for determining the current notch frequency.

According to the present invention, in a second aspect, there is provided a method for adaptive line enhancement, comprising adaptive line enhancing an adaptive Gray-Markel lattice notch filter with an adaptive notch frequency, in which the notch frequency is determined according to a notch frequency variable k, characterized in that the value of k for the n+1$^{th}$ sample period is determined according to the following equation:

$$k(n+1)=k(n)-\text{sgn}[y(n)]\text{sgn}[\text{UPDATEFN}]\times\mu$$

in which y(n) is the notch filter output, $\mu$ is the adaptation constant, and UPDATEFN has a transfer function in the z-transform domain of:

$$\frac{(\alpha-1)(k(n)-1)z^{-1}}{1+k(n)(1+\alpha)z^{-1}+\alpha z^{-2}}$$

in which $\alpha$ determines the bandwidth and k(n) determines the current notch frequency.

This algorithm for adapting the notch frequency enables UPDATEFN and the notch frequency variable to be directly calculated from knowledge of internal variables of the wave digital filter The update rule for k(n) in this algorithm is very simple and requires, when compared with the prior art notch filter of FIG. 1, only an extra computational load of one addition, two sign operators and an EXOR operator (for doing the multiplication of the two signs). Together with the operation for calculating the WDF filter structure, this makes a total of two multiplications, eight additions, one bit-shift, two sign operators and one EXOR operator, for each processed input sample.

This represents a saving of three multiplications and two additions which would otherwise be needed to calculate the simplified gradient each sample period, according to Equation B.

BRIEF DESCRIPTION OF THE DRAWINGS

For a better understanding of the invention, and to show how an embodiment of the same may be carried into effect, reference will now be made, by way of example, to the accompanying diagrammatic drawings in which.

DESCRIPTION OF THE PREFERRED EMBODIMENTS

Figure 1:
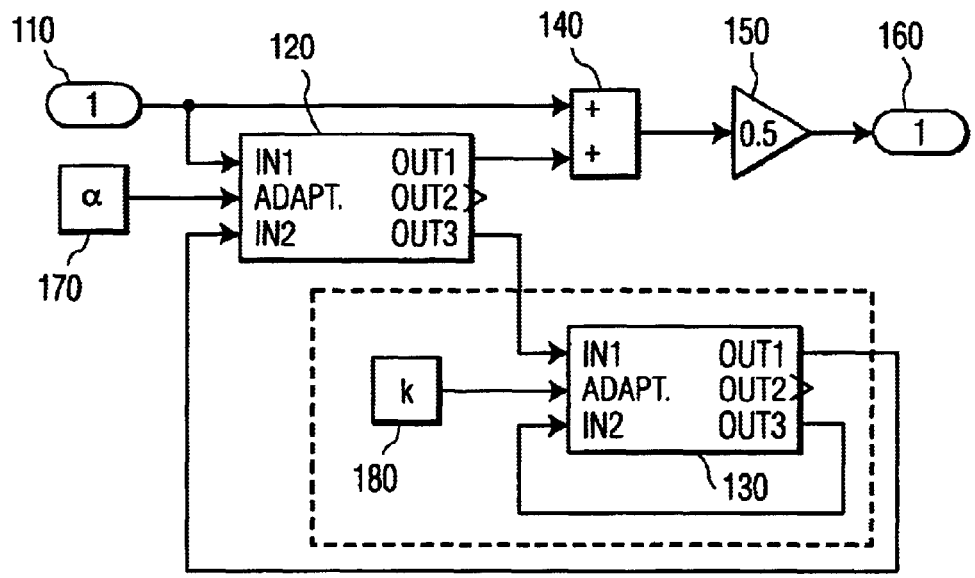
FIG. 1 is a schematic block diagram illustrating means of implementing a prior art Gray-Markel notch filter using a wave digital filter.
Figure 2:
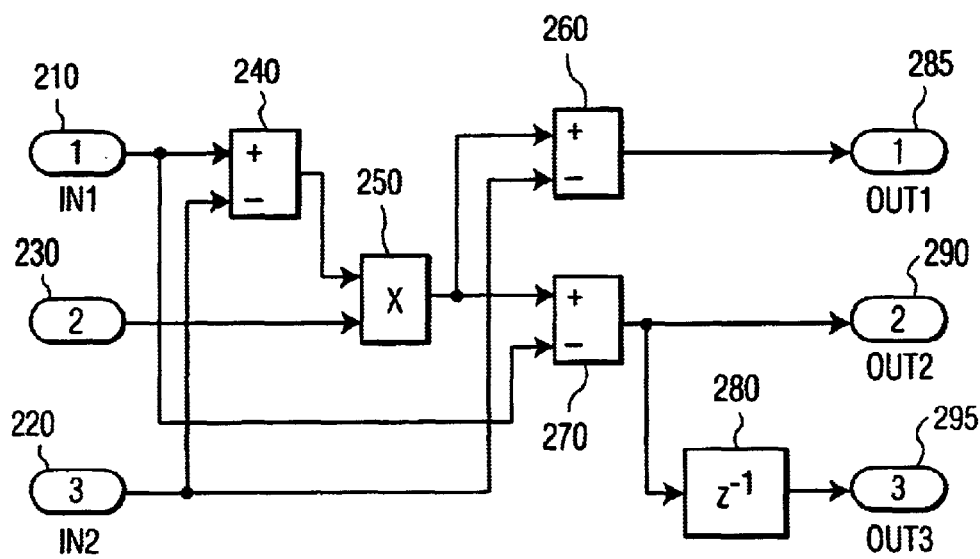
FIG. 2 shows a schematic block diagram illustrating means of implementing the "dynamic adapter" shown in FIG. 1.
Figure 3:
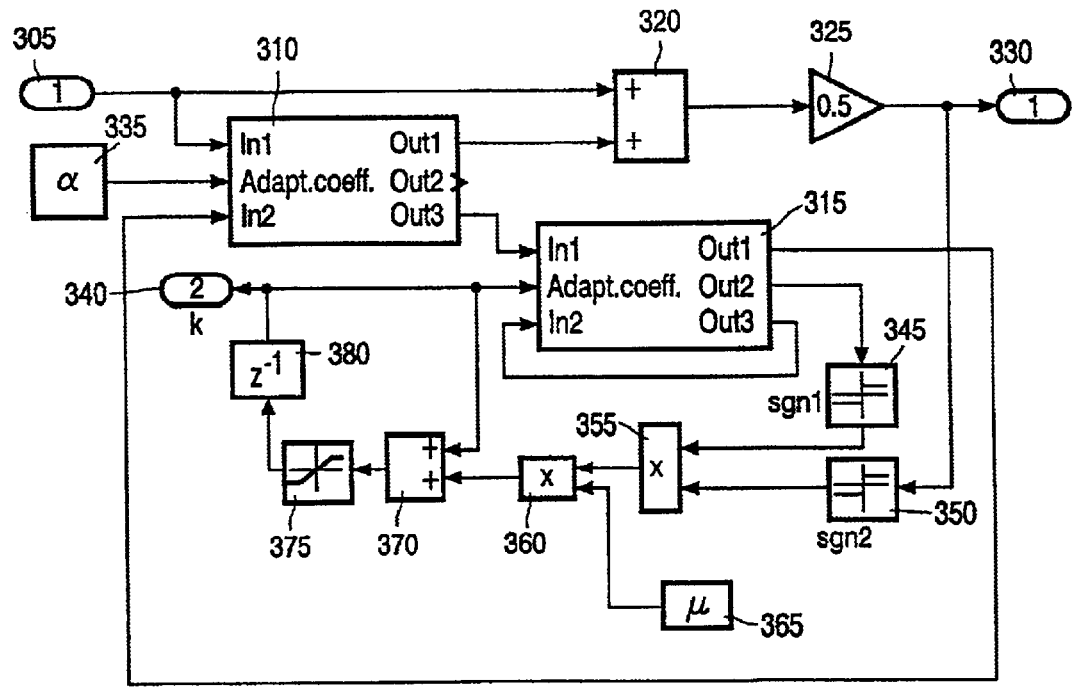
FIG. 3 shows a schematic block diagram illustrating an adaptive line enhancer according to the present invention.
Figure 5:
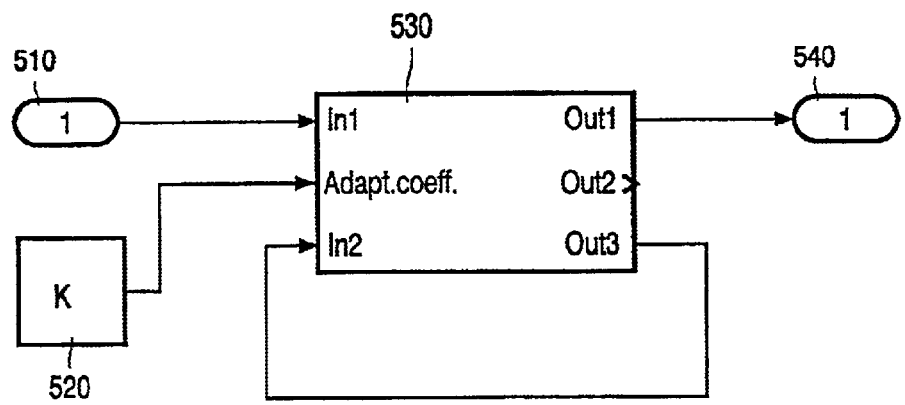
FIG. 5 shows a schematic block diagram illustrating the "dynamic adapter" in a feedback configuration.

Referring now to FIG. 3, there is shown a block diagram that is identical to the FIG. 1 block diagram except that the block diagram of FIG. 3 includes additional feedback elements for implementing the low complexity adaptation algorithm that forms the basis of the invention.

In FIG. 3, there is shown an input 305 u(n), a first dynamic adapter block 310, a second dynamic adapter block 315, a first summing block 320, an amplifier block 325, an output 330, a notch bandwidth determining block 335, a notch frequency determining block 340, a first signum function block 345, a second signum function block 350, a first multiplier 355, a second multiplier 360, an adaptation speed determining block 365, a second summing block 370, an amplitude limiting block 375 and a delay block 380.

An input signal 305 is fed through a first input of the first summing block 320 and to a first input of the first dynamic adapter block 310. A first output of the first dynamic adapter block 310 is fed to a second input of the first summing block 320. The output of the first summing block 320, comprising the result of the addition of input 305 and a first output of the first dynamic adapter block 310, is fed to an input of the amplifier block 325. The amplifier block 325 has a fixed amplitude gain of 0.5. This gain is achieved by a bit-shift operation, and thus, does not require a multiplier. The output of the amplifier block 325 becomes the output signal 330, and is also fed to the input of second signum function block 350. A second output of the first dynamic adapter block 310 is left unconnected. A third output of the first dynamic adapter block 310 is fed to a first input of the second dynamic adapter block 315. A first output of the second dynamic adapter block 315 is fed back to a second input of the first dynamic adapter block 310. The output of the notch bandwidth determining block 335 is fed to a third input of the first dynamic adapter block 310. A second output (out2) of the second dynamic adapter block 315 is fed to the input of the first signum function block 345. A third output of the second dynamic adapter block 315 is fed back to a second input of the second dynamic adapter block 315. The output of the first signum function block 345 is fed to a first input of the first multiplier 355, and the output of the second signum function block 350 is fed to a second input of the first multiplier 355. The output of the first multiplier 355, comprising the product of the output of the first signum function block 345 and the second signum function block 350, is fed to a first input of the second multiplier 360. The output of the adaptation speed determining block 365 is fed to a second input of the second multiplier 360. The output of the second multiplier 360, comprising the product of the output of the first multiplier block 355 and the output of the adaptation speed determining block 365, is fed to a first input of the second summing block 370. The output of the notch frequency determining block 340 is fed to a third input of the second dynamic adapter block 315 and to a second input of the second summing block 370. The output of the second summing block 370, comprising the sum of the output of the second multiplier 360 and the output of the notch frequency determining block 340, is fed to the input of the amplitude (saturation) limiting block 375. The output of the amplitude limiting block 375 is fed to the input of the delay block 380. The output of the delay block 380 becomes the updated value of the notch frequency determining block 340 and, accordingly, is fed to a third input of the second dynamic adapter block 315.

Amplitude limiting block 375 prevents k(n+1) from becoming $\geq 1$ or $\leq -1$. When $|k(n+1)| \geq 1$, the notch filter becomes unstable. To prevent instability, k(n+1) is clipped into the open interval ]−1 1[. This is done as follows:

If $k(n+1) \geq$ ClipValue then $k(n+1)$=clipvalue

If $k(n+1) \leq$ ClipValue then $k(n+1)$=−clipvalue where clipvalue is slightly less than 1, e.g., 0.999. This is also referred to as stability monitoring.

The second output Out 2 of the second dynamic adapter 315 is used to generate the k(n+1) value, used as a variable to determine the update for the adaptive coefficient determining the notch frequency. The signum of Output2 of the second dynamic adapter 315 is generated by the first signum block 345, which is multiplied by the first multiplier 355 with the signum of the output of the amplifier block 325 (which is y(n), the notch filter output), the signum of the output of the amplifier block 325 being carried out by the second signum block 350. This, therefore, generates sgn[y(n)]sgn[Out2] as the output of first multiplier 355. This is then multiplied by adaptation constant $\mu$ from the adaptation speed determining block 365 at the second multiplier 360 and subtracted from the current k(n) to generate k(n+1).

Thus, the second output Out2 of the second dynamic adapter 315 is used as an update function (UPDATEFN). As shown in the table above (reference Output$_2$Adaptor$_2$), UPDATEFN has a transfer function in the z-transfer domain, for an $n^{th}$ sample of:

$$\frac{(\alpha - 1)(k(n) - 1)z^{-1}}{1 + k(n)(1 + \alpha)z^{-1} + \alpha z^{-2}}$$

Figure 4:
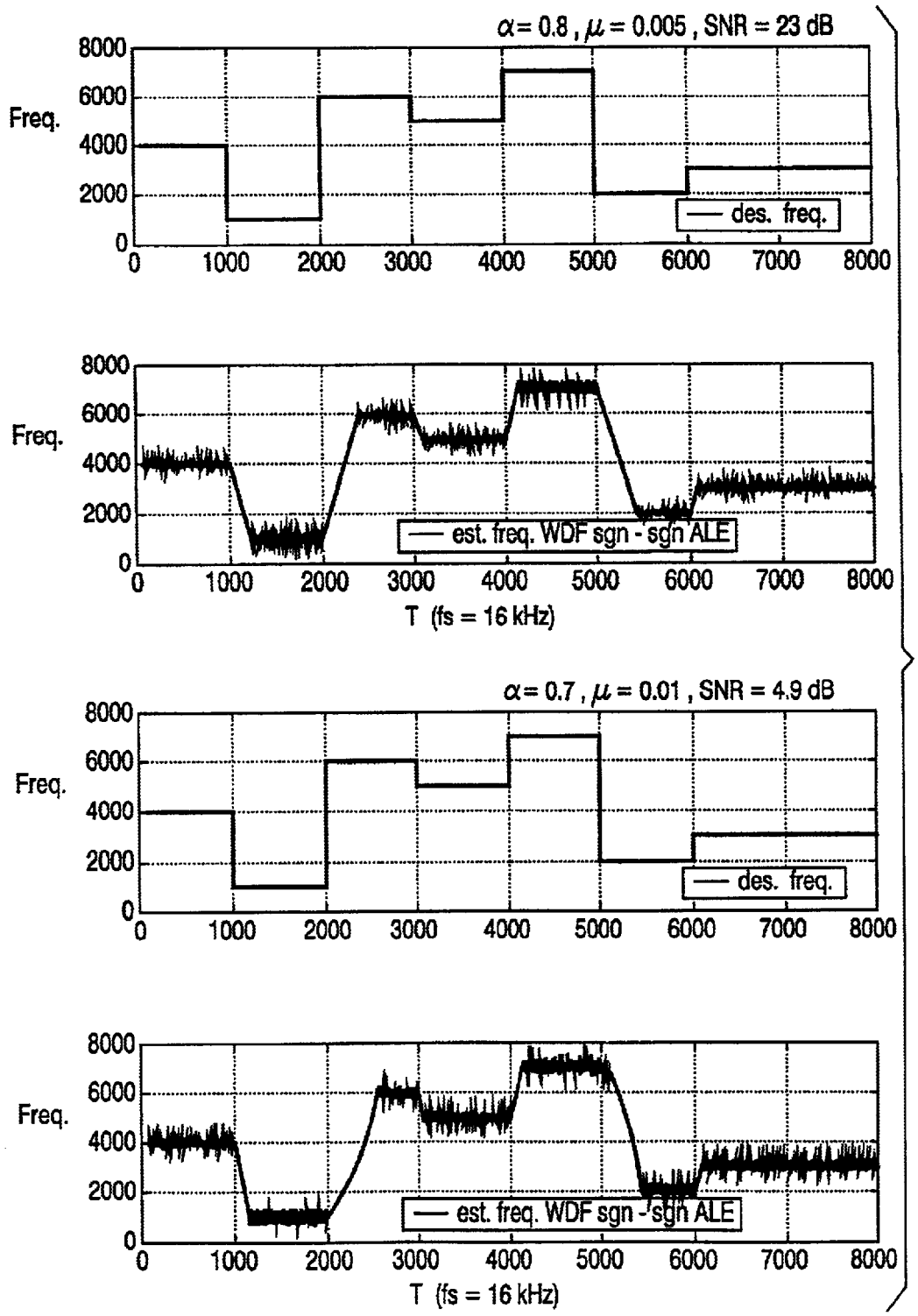
FIG. 4 shows the results of a frequency hop experiment used to evaluate the effectiveness of an embodiment of the present invention.

The embodiment of the present invention, represented diagrammatically by the block diagram shown in FIG. 3, has significant advantages over prior realizations of ALEs, particularly in terms of minimizing the amount of hardware needed to carry out the ALE procedure and minimizing the computational load needed to carry out the ALE procedure on any digital processor. FIG. 4 shows the results of a frequency hop experiment in which the input signal, supplied to the embodiment of the invention shown in FIG. 3, is a sine wave immersed in white noise and sampled at a sampling rate $f_s$, equal to 16 kHz. The frequency of the sine wave changes randomly every 1000 samples. The first graph (from top to bottom) shows the desired frequency (des freq) with $\alpha$=0.8, $\mu$=0.005 and SNR=23 dB. The second graph shows the estimated frequency (est freq) using an ALE of the described embodiment of the present invention. The third graph corresponds to the first graph except that $\alpha$=0.7, $\mu$=0.001 and SNR=4.9 dB. The fourth graph shows the corresponding estimated frequency using an ALE of the described embodiment of the present invention.

The embodiment of the present invention is used to make an estimate of this desired frequency $f_{freq.estim.}(n)$ for each time step by using:

$$f_{freq.estim.}(n) = \frac{f_s}{2\pi} \cos^{-1}[-k(n)] \quad \text{(Equation E)}$$

To quantify the achievable accuracy of the frequency estimation given by this algorithm in case of the frequency hop experiment, it can be proven that the standard deviation of the estimated frequency $\omega_0 = \cos^{-1}(-k_0)$ shows following proportional relationship:

$$\sigma_{freq.estim.} \approx \frac{\mu}{\sqrt{1-k_{real}^2}} \qquad \text{(Equation F)}$$

The estimate of the desired frequency will be converged onto the desired frequency in a time showing the following proportional relationship:

$$T_{conv} \approx \frac{1}{\mu} \text{samples} \qquad \text{(Equation G)}$$

By choosing appropriate values for $\alpha$ and $\mu$ by inspection of equations F and G and/or basic experimentation, useful adaptive sinusoid tracking can be achieved for various signal-to-noise ratios, as is demonstrated in FIG. 4.

Accordingly, the variable k, used for determining the notch frequency, is itself determined by an output of the second dynamic adapter i.e., internally rather than externally.

All of the features disclosed in this specification (including any accompanying claims, abstract and drawings), and/or all of the steps of any method or process so disclosed, may be combined in any combination, except combinations where at least some of such features and/or steps are mutually exclusive.

Each feature disclosed in this specification (including any accompanying claims, abstract and drawings), may be replaced by alternative features serving the same, equivalent or similar purpose, unless expressly stated otherwise. Thus, unless expressly stated otherwise, each feature disclosed is one example only of a generic series of equivalent or similar features.

The invention is not restricted to the details of the foregoing embodiment(s). The invention extend to any novel one, or any novel combination, of the features disclosed in this specification (including any accompanying claims, abstract and drawings), or to any novel one, or any novel combination, of the steps of any method or process so disclosed.

What is claimed is:

1. An adaptive line enhancer comprising an adaptive Gray-Markel lattice notch filter having an adaptive notch frequency, said adaptive Gray-Market lattice notch filter having a transfer function:

$$H_{lattice} = \frac{N(z)}{D(z)} = \left(\frac{1+\alpha}{2}\right)\frac{1+2k_0 z^{-1} + z^{-2}}{1+k_0(1+\alpha)z^{-1} + \alpha z^{-2}},$$

in which the notch frequency is determined according to a notch frequency variable k,
characterized in that said adaptive line enhancer further comprises means for determining a value of k for the $n+1^{th}$ sample period according to the following equation:

$$k(n+1)=k(n)-\text{sgn}[y(n)]\text{sgn}[\text{UPDATEFN}]\times\mu$$

in which y(n) is a notch filter output, $\mu$ is an adaptation constant, and UPDATEFN has a transfer function in the z-transform domain of:

$$\frac{(\alpha-1)(k(n)-1)z^{-1}}{1+k(n)(1+\alpha)z^{-1}+\alpha z^{-2}}$$

where $\alpha$ determines a bandwidth and k(n) is a variable for determining a current notch frequency.

2. The adaptive line enhancer claimed in claim 1, in which the Gray-Markel lattice notch filter is a wave digital lattice filter.

3. The adaptive line enhancer claimed in claim 2, in which the wave digital lattice filter comprises:
   a first dynamic adapter having a first input coupled to receive an input signal of the adaptive line enhancer, a second input and an adaptive coefficient input;
   a bandwidth determining block coupled to said adaptive coefficient input of said first dynamic adapter;
   a first summing block for summing the input signal and a first output from the first dynamic adapter;
   an amplifier block for amplifying an output of first summing block and for supplying said amplified output to an output of the adaptive line enhancer; and
   a second dynamic adapter having a first input coupled to a third output of the first dynamic adapter, a first output coupled to a second input of the first dynamic adapter, a second output, a third output coupled, in feedback, to a second input of the second dynamic adapter, and an adaptive coefficient input.

4. The adaptive line enhancer claimed in claim 3, in which the first and second dynamic adapters each comprises:
   a first input;
   a second input;
   an adaptive coefficient input;
   a first subtracter for subtracting the second input from the first input;
   a multiplier for multiplying an output of the first subtracter by the adaptive coefficient input;
   a second subtracter for subtracting the second input from an output of the multiplier; and
   a third subtracter for subtracting the first input from the output of the multiplier,
wherein a first output is provided by an output of the second subtracter, a second output is provided by an output of the third subtracter, and a third output is provided by the output of third subtracter having been delayed by a delay block.

5. The adaptive line enhancer as claimed in claim 3, in which the adaptive line enhancer further comprises:
   a first siqnum function block for providing the adaptive coefficient input for the second dynamic adapter, said first signum function block being coupled to receive the second output from the second dynamic adapter;
   a second signum block for receiving the amplified output from the amplifier block;
   a first multiplier for multiplying outputs of the first and second signum blocks;
   an adaptation speed determining block for generating an output to determine a speed at which the desired frequency is locked onto;
   a second multiplier for multiplying outputs of the first multiplier and the adaptation speed determining block;
   a second summing block for summing an output of the second multiplier and an output of a notch frequency determining block;
   an amplitude limiting block for clipping an output k(n+1) of the second summing block (370) within a range]−1 1[; and
   a delay block for delaying an output of the amplitude limiting block, an output of the delay block comprising the adaptive coefficient input and an updated value of the notch frequency determining block.

6. A method for adaptive line enhancement, comprising the step of:

adaptive line enhancing an adaptive Gray-Markel lattice notch filter with an adaptive notch frequency, said adaptive Gray-Markel lattice notch filter having a transfer function:

$$H_{lattice} = \frac{N(z)}{D(z)} = \left(\frac{1+\alpha}{2}\right)\frac{1+2k_0 z^{-1}+z^{-2}}{1+k_0(1+\alpha)z^{-1}+\alpha z^{-2}},$$

in which the notch frequency is determined according to a notch frequency variable k,
characterized in that said method further comprises the step of:

determining a value of k for the $n+1^{th}$ sample period according to the following equation:

$k(n+1)=k(n)-\text{sgn}[y(n)]\text{sgn}[\text{UPDATEFN}]\times\mu$ in which y(n) is a notch filter output, $\mu$ is an adaptation constant, and UPDATEFN has a transfer function in the z-transform domain of:

$$\frac{(\alpha-1)(k(n)-1)z^{-1}}{1+k(n)(1+\alpha)z^{-1}+\alpha z^{-2}}$$

in which a determines a bandwidth and k(n) determines a current notch frequency.

7. The method for adaptive line enhancement as claimed in claim 6, in which the Gray-Markel lattice notch filter is a wave digital lattice filter.

* * * * *